United States Patent [19]

Ten Eyck

[11] Patent Number: 5,160,882

[45] Date of Patent: Nov. 3, 1992

[54] VOLTAGE GENERATOR HAVING STEEP TEMPERATURE COEFFICIENT AND METHOD OF OPERATION

[75] Inventor: Timothy A. Ten Eyck, Dallas, Tex.

[73] Assignee: Texas Instruments Incorporated, Dallas, Tex.

[21] Appl. No.: 502,388

[22] Filed: Mar. 30, 1990

[51] Int. Cl.⁵ .................................................. G05F 3/16
[52] U.S. Cl. ........................................ 323/314; 323/313; 323/907
[58] Field of Search .......................... 323/313, 314, 907; 307/310, 296.1

[56] References Cited

U.S. PATENT DOCUMENTS

| | | | |
|---|---|---|---|
| 4,460,865 | 7/1984 | Bynum et al. | 323/313 |
| 4,533,842 | 8/1985 | Yang et al. | 323/313 |
| 4,968,905 | 11/1990 | Sanwo et al. | 307/310 |
| 5,087,831 | 2/1992 | Ten Eyck | 323/313 |

*Primary Examiner*—Steven L. Stephan
*Assistant Examiner*—Jeffrey Sterrett
*Attorney, Agent, or Firm*—Scott B. Stahl; René E. Grossman; Richard L. Donaldson

[57] ABSTRACT

There is disclosed a circuit and method for providing bias voltage levels which are precisely controlled as a function of temperature. The circuit is arranged to mix a precise bandgap regulated voltage with a temperature compensated circuit to provide the required output. The temperature compensated circuit is in turn arranged to mimic the temperatue sensitive components in the output circuit.

8 Claims, 4 Drawing Sheets

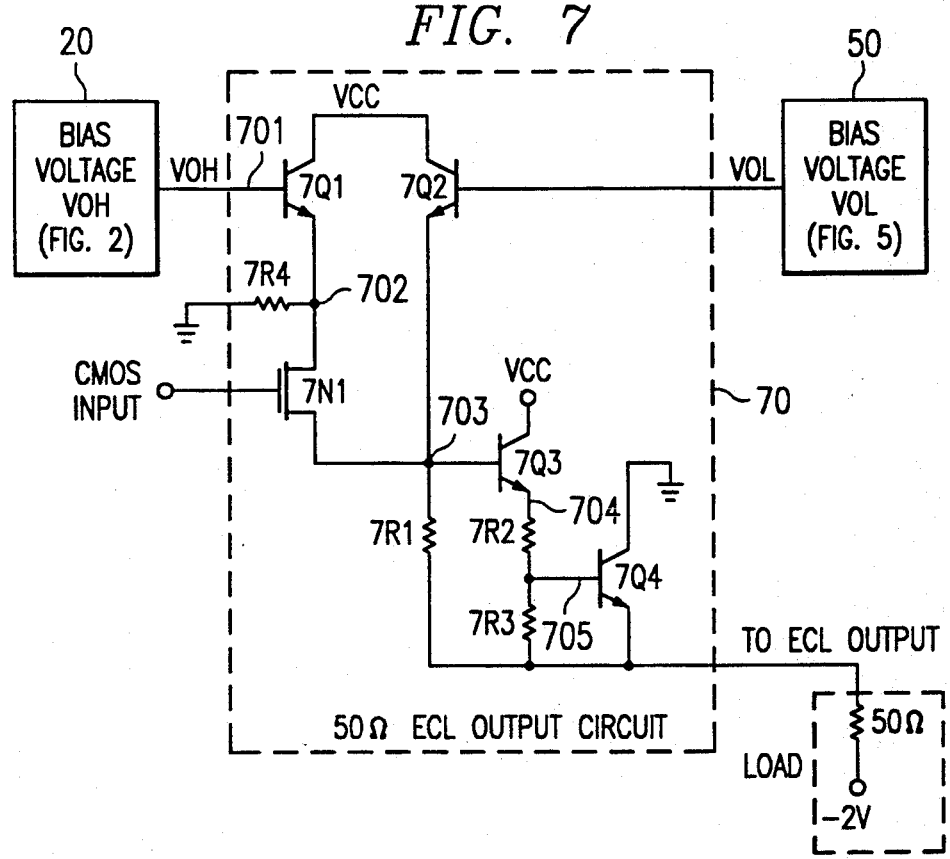
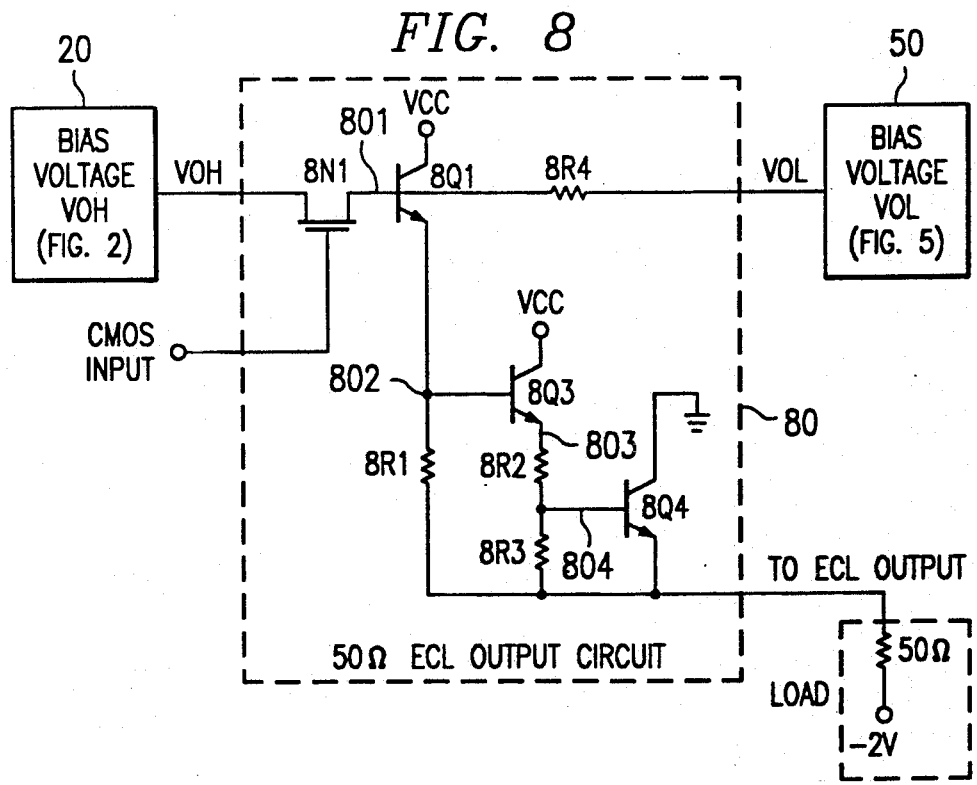

VOLTAGE GENERATOR HAVING STEEP TEMPERATURE COEFFICIENT AND METHOD OF OPERATION

TECHNICAL FIELD OF THE INVENTION

This invention relates generally to voltage generator circuits and methods of operation and more particularly to such circuits having steep temperature coefficients which are precisely controlled.

RELATED APPLICATIONS

All of the following patent applications are cross-referenced to one another, and all have been assigned to Texas Instruments Incorporated. These applications have been concurrently filed and are hereby incorporated in this patent application by reference.
Positive to Negative Voltage Translator Circuit and Method of Operation
Voltage Generator Having Steep Temperature Coefficient and Method of Operation
Voltage Reference Having Steep Temperature Coefficient and Method of Operation
Translator Circuit and Method of Operation
Voltage Stabilization Circuit and Method of Operation

BACKGROUND OF THE INVENTION

There are many circuits, particularly voltage level detector circuits which must discriminate between two voltage levels. A common element of these circuits is that a reference voltage level must be established around which the level detection is founded.

Problems exist, however, when it is understood that the voltage level must be stabilized for temperature changes. Many standard circuits are now available which provide for very stable voltages over wide temperature swings. The problem is that some detector circuits themselves change their internal parameters dependant upon temperature. Thus, in these situations, the reference voltage must also change with respect to temperature to compensate.

A further problem exists in that in some situations, such as a ECL to CMOS logic level conversion circuit, there are different standards to which the reference voltage must be keyed. One of these standards requires the reference voltage to change with temperature while the other standard requires a reference voltage which is constant with respect to temperature changes. It is important to have a reference voltage which is easily converted from one standard to the other with a minimum of difficulty.

This problem is compounded in that, as discussed above, a constant reference voltage can not be used in any event due to changes in the converter circuit.

Thus, a need exists in the art for a voltage reference circuit which changes reference levels based upon temperature gradients with the rate of change very precisely controlled and matched to a given set of circuit components.

A further need exists in the art for such a circuit which can easily be adjusted to have different temperature coefficients to meet different standards.

SUMMARY OF THE INVENTION

By combining a standard bandgap voltage regulator having a stable output voltage which is stable over a wide temperature range with a voltage compensation network which is temperature sensitive, two reference voltages (VOH and VOL) are generated each having a known temperature/voltage slope. The system mimics the output ECL circuit depending upon the standard desired while also being relatively insensitive to power supply variations.

Because of limited voltage range for compensation purposes, the circuit cannot be made "perfect", however, the circuit is designed to mimic the most critical output components, thereby resulting in very close approximations to a circuit having the ideal temperature/voltage slope.

Accordingly, it is a technical advantage of this invention to provide a reference voltage source which is precisely defined with respect to variations as a function of temperature.

It is a further technical advantage of this invention to provide such a circuit using a known bandgap generator having a known temperature/voltage slope with a correction circuit having a controlled temperature/voltage slope to provide an output which is variable according to the variation in selected components of the circuit utilizing the reference voltage.

It is a still further technical advantage of this invention to provide a reference voltage generator having steeply changing and yet precisely definable output voltages as a function of temperature while being able to easily change the defined characteristics.

BRIEF DESCRIPTION OF THE DRAWINGS

FIGS. 7, and 8 show alternate embodiments of the CMOS to ECL translation circuits.

DETAILED DESCRIPTION OF THE INVENTION

Figure 1:
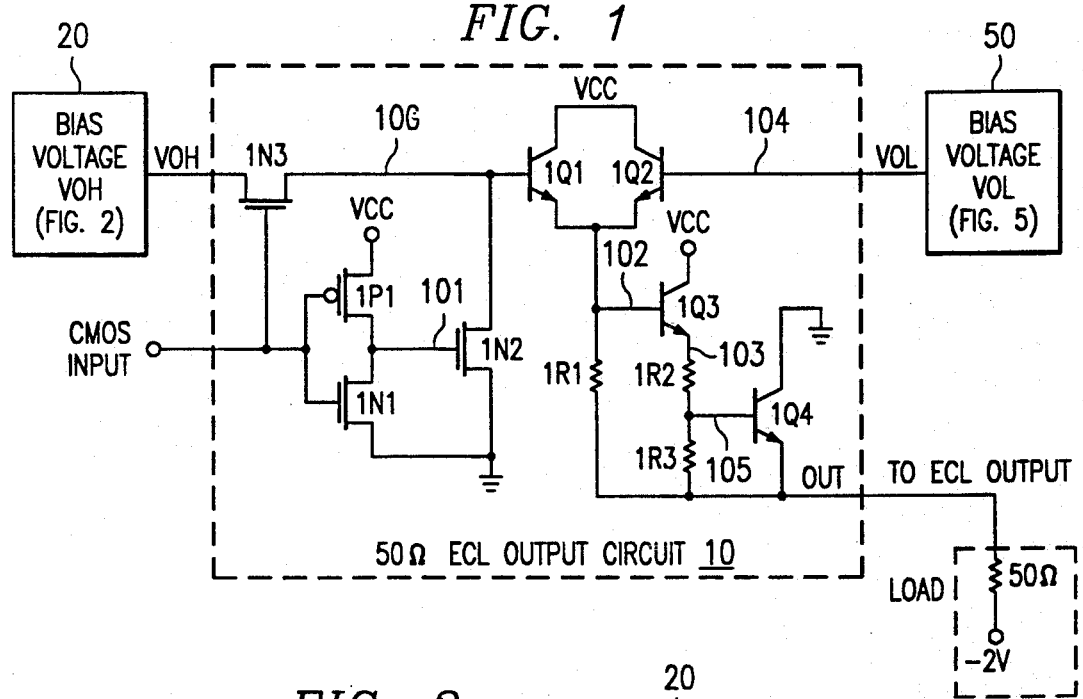
FIG. 1 shows a schematic of the CMOS to ECL output circuit.

Turning now to FIG. 1, there is a zero and five volt signal swing on the CMOS input as the input goes from a logic low to a logic high. The logic high turns on N channel transistor 1N3 which basically connects bias voltage VOH to node 100. However, node 100 is low because N channel transistor 1N2 is on. Concurrently the low to high transition at the input turns N channel transistor 1N1 on, which essentially provides a low level or zero volts on node 101. Zero volts on node 101 turns 1N2 off. Thus, when a high level is present on the CMOS input, devices 1P1 and 1N1, form what is called a CMOS invertor, which inverts the level on the input to node 101. When node 101 is at a low level, 1N2 is off, thereby no longer pulling down node 100.

Since 1N3 is on, the bias voltage VOH, from bias voltage source 20, brings node 100 to +2 volts at a nominal temperature of 25 deg. C. Based on these parameters, the DC level on lead VOL, from bias voltage source 50 is set to 1.1 volt. Because the voltage on node 100 is much higher than the bias voltage on node 104, the transistor 1Q1 is turned on and the transistor 1Q2 is off. When transistor 1Q1 is turned on, it is biased by resistor 1R1 so there is essentially an 800 millivolt drop from node 100 to node 102. Resistors 1R2 and 1R3 serve to bias transistor 1Q3 on so there is another VBE (voltage, base to emitter) drop from node 102 to node 103.

The output load of the ECL circuit consists of a 50 ohm resistor and a −2 volt supply and serves to bias transistor 1Q4 on. Transistor 1Q4's collector is connected to ground so we have created a voltage drop from node 100 to the output node. There is a drop of 3 VBE's (transistors 1Q1, 1Q3, 1Q4) plus an IR drop across resistor 1R2 with the I being the emitter current of transistor 1Q3. Accordingly, this sets up the voltage level in the high (or on) state.

Now if a low level is detected at the input, 1N3 is turned off, which again disconnects the bias VOH level from node 100. This same low causes node 101 to go high, turning on 1N2 which pulls node 100 down to ground, and shuts off transistor 1Q1.

Digressing momentarily, it should be noted that without 1N3 in the circuit, node 100 would be pulled to ground when a low appeared at the input. This ground would essentially ground the bias source thereby pulling enormous amounts of current from bias voltage source 20. Switch 1N3 just shuts that off and disconnects the ground from lead VOH.

Returning now, with a ground on node 100, transistor 1Q1 is off and transistor 1Q2 is on under control of the bias voltage VOL from source 50. The bias voltage VOL sets the low level on the output in the same manner as the bias VOH voltage sets the high level. Thus, there is a drop of 3 VBE's (transistors 1Q2, 1Q3 and 1Q4) below that bias level, plus the voltage drop across resistor 1R2. To recap, bias voltage VOH is a +2 volts at room temperature of 25 deg. C, and bias voltage VOL is at a +1.1 volts at that temperature.

Both of the bias voltage levels have very steep temperature coefficients associated with them such that the temperature aspects of the circuit can be corrected. One goal of this circuit is to achieve a very high speed throughput. This is achieved by having transistors 1Q3 and 1Q4 biased on at all times. Thus, we only need shift the outputs between the VOL and VOH levels. Since transistors 1Q3 and 1Q4 are both turned on and arranged as an emitter follower, this happens very quickly.

The one different AC aspect of this circuit that is not apparent at first look is in the operation of resistor 1R2. Without resistor 1R2 in the circuit there would be formed a Darlington pair between transistors 1Q3 and 1Q4 so as the circuit goes from a low to a high transition, node 105 would change very quickly causing a ringing condition in the output circuit. This is not desirable, and resistor 1R2 was added.

Basically, the circuit works such that node 103 comes high very quickly under control of node 102 which, in turn, is controlled by node 100. However, node 105 is trying to come high as well, but as node 105 approaches the potential on node 103, resistor 1R2 limits base drive to transistor 1Q4 allowing the voltage at the output of transistor Q4 to change a little slower. As the voltage on node 105 comes higher and approaches the voltage on node 103, the tendency is to reduce the current drive to the base of transistor 1Q4, thus lessening the speed of change.

Again in the AC operation, transistors 1Q3 and 1Q4 are on all the time so their VBE's are essentially maintained during the low to high transition. But nodes 105, 103 and 102 are moving by at least the amount the output is moving from a low to high transition so they are moving even though we are not maintaining a constant voltage drop across transistors 1Q3 and 1Q4.

Bias VOH

As shown in FIG. 1, the voltage difference from node bias VOH to node OUT decreases as temperature increases. For proper circuit operation, it is necessary for the voltage on node bias VOH to also decrease as temperature increases in order for the output voltage to remain constant over temperature.

Figure 9:
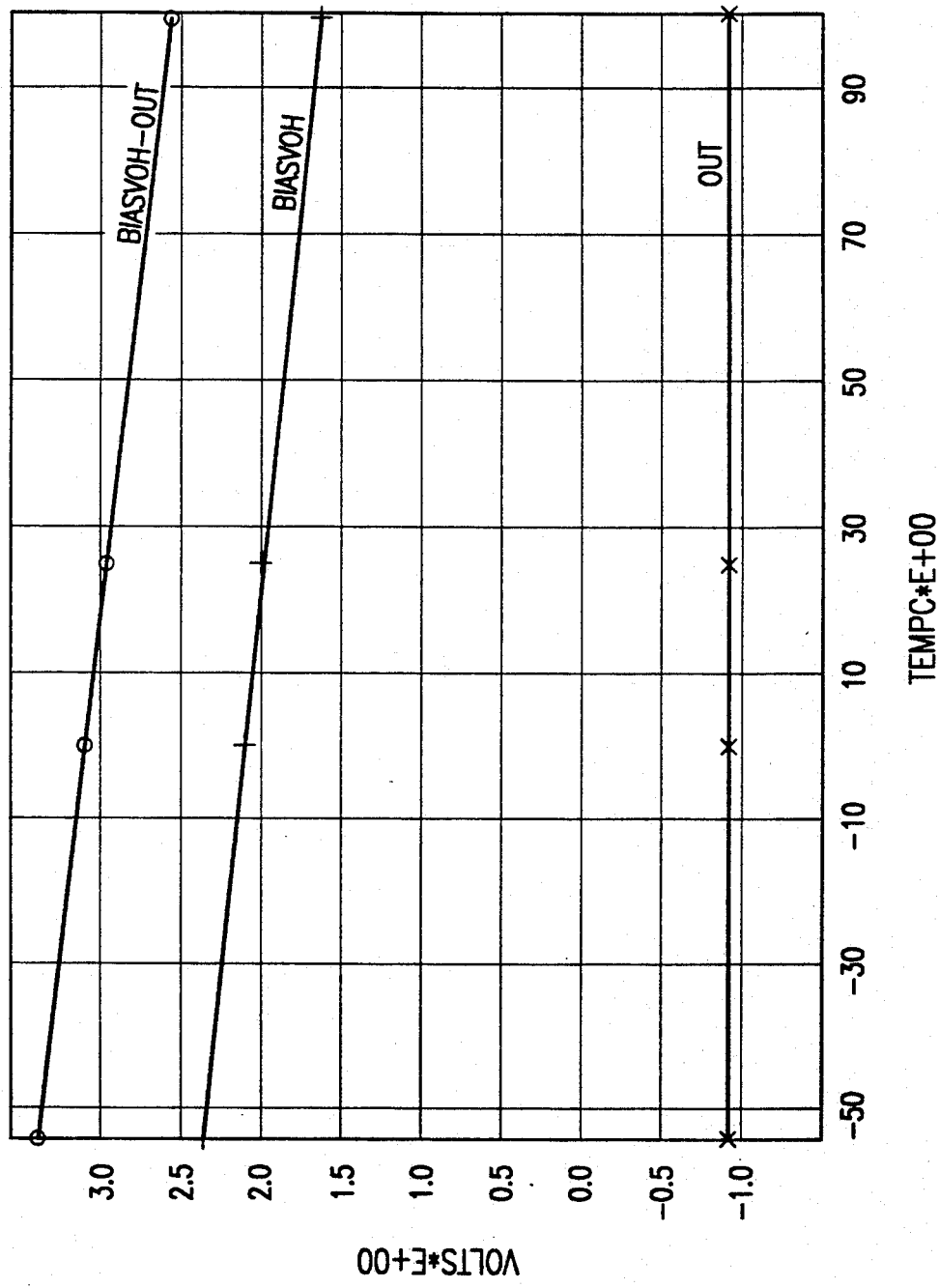
FIG. 9 shows typical temperature/voltage graphs.

In FIG. 9, the voltage on node bias VOH and the difference in the voltage between nodes bias VOH and OUT (bias VOH−OUT), have a negative temperature coefficient. In other words, both voltages decrease as temperature is increased. The third trace in FIG. 9 shows the output voltage (VOUT=VBIASVOH−(-VBIASVOH−VOUT). Since the slope (or temperature coefficient) of bias VOH is equivalent to the slope of bias VOH−OUT, the temperature coefficient of the output is equal to zero. TC OUT=TC BIASVOH−TC (BIASVOH−OUT). TC OUT=0 if TC BIAS-VOH=TC (BIAS VOH−OUT).

Figure 2:
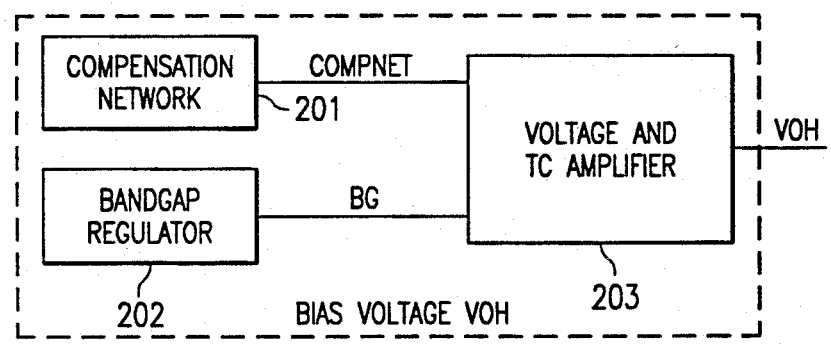
FIG. 2 is a block diagram of the high bias voltage circuit.

FIG. 2 shows bias voltage VOH generator 20 having bandgap regulator 202 which is well known in the art and which creates a constant 1.27 volt source which is constant over temperature. The purpose of compensation network 201 is to mimic the critical aspects of the ECL output circuit so that if the output circuit varies with processing so will the compensation network. Ideally, compensation network 201 would mimic all the devices in the output circuit which affect the VOH level (or the VOL level). Due to the need for the compensation network to be insensitive to both power supply variations and to the voltage differential, of about 3V, across the output circuit, there is not enough headroom in the voltage supply VCC to handle the ideal case so the compensation network mimics only transistors 1Q3 and 1Q4 of the 50 ohm ECL output circuit 10, FIG. 1.

Figure 3:
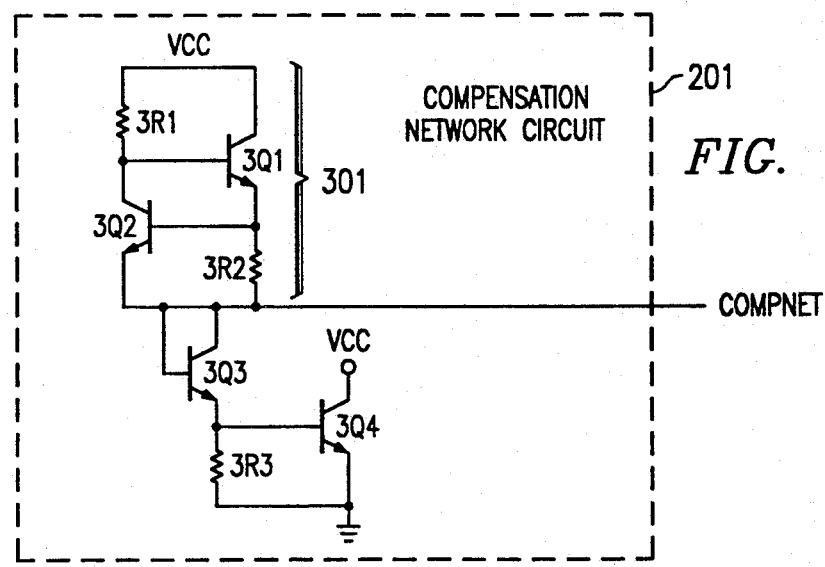
FIG. 3 shows the schematic for the compensation network of the high bias voltage circuit.

Compensation network 201 is shown in FIG. 3 having the combination of transistors 3Q1 and 3Q2 with resistors 3R1 and 3R2 forming a current source 301, which is constant for a given voltage supply VCC range. In this situation, the circuit must work between 4.5 volts and 5.5 volts so the transistors 3Q1, 3Q2 and resistors 3R1, 3R2 must be selected to avoid variances in current due to voltage supply variances.

Thus, current source 301 biases transistor 3Q3 on so that current goes through transistor 3Q3. Transistor 3Q3 is actually connected to form a diode with the base shorted back to the collector. Current from current source 301 flows through the diode formed by transistor 3Q3 and also flows through resistor 3R3 to ground. Resistor 3R3 serves to bias transistor 3Q4 on. Depending upon where we set the base emitter voltage on transistor 3Q4 that determines the amount of current flowing through transistor 3Q4. Transistors 3Q3 and 3Q4 are half the size of the transistors in output circuit 10 (FIG. 1) and so we set the current to have half the current flowing through these transistors. Therefore, we have the same current density that we have in output circuit 10. This was done such that transistors 3Q3 and 3Q4 would mimic transistors 1Q3 and 1Q4 of FIG. 1 and thus, compensation network 201 mimics the temperature coefficient of the critical components (1Q3, 1Q4) of output circuit 10 and is essentially two VBE's up from ground or 1.72 volts nominally. This voltage, as discussed, is temperature sensitive. When the voltage of compnet is added to the BG voltage (1.27 volts) via amplifier 203, FIG. 3, we obtain a result equal to approximately −2.77 millivolts per degree C.

Figure 4:
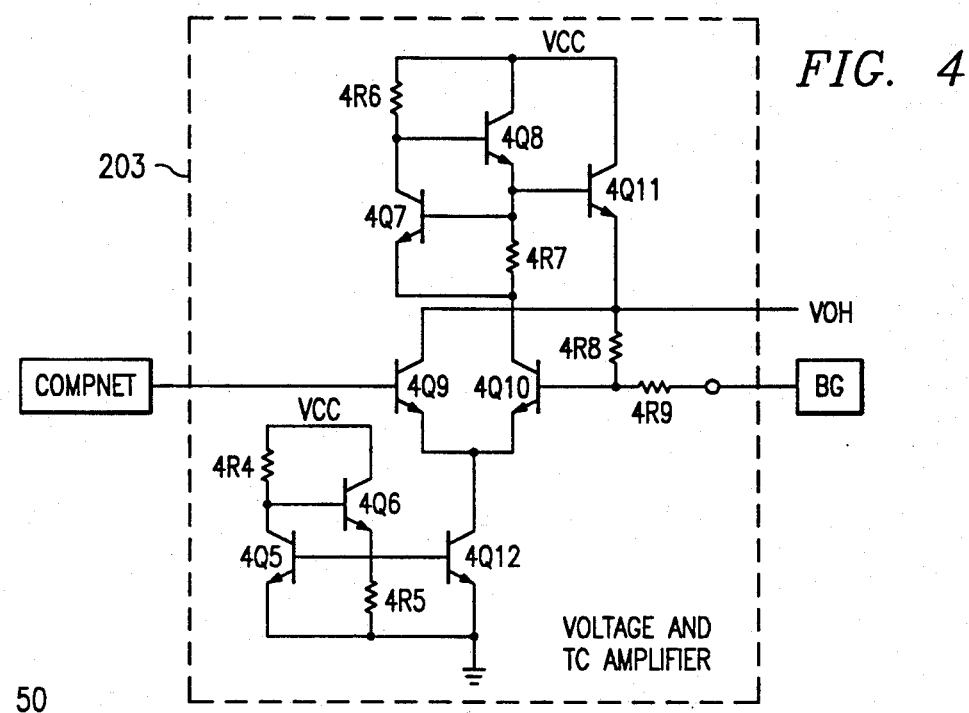
FIG. 4 shows a schematic of the voltage and temperature coefficient amplifier circuit.

Voltage amplifier 203 is shown in FIG. 4 having two inputs, one labelled BG and one labelled compnet. Lead BG is the output of bandgap regulator 202, and, as discussed, has a constant 1.27 volts on it. Compnet is coming from the output of compensation network 201 just described. The output of the circuit is labelled bias VOH. Bias VOH is the final bias level we are trying to achieve with this circuit so it must have a specific voltage level and a specific temperature coefficient associated therewith.

What we have in voltage amplifier 203 is transistor 4Q12 which is part of a current mirror which biases on the differential transistor pair which is formed by transistors 4Q9 and 4Q10. Transistor 4Q12 sets the current in transistors 4Q9 and 4Q10, and this is set from the voltage source created by transistors 4Q5 and 4Q6 and resistors 4R4 and 4R5. This is basically just a current mirror so the potential at the base of transistor 4Q5 is also the potential at the base of transistor 4Q12, and that sets the current through transistor 4Q12. If we add up the emitter current in transistor 4Q9 and the emitter current in transistor 4Q10, it is going to equal the collector current in transistor 4Q12. Accordingly, transistor 4Q12 serves to bias transistors 4Q9 and 4Q10 on. Now transistors 4Q7, 4Q8 and resistors 4R6 and 4R7 form another current source which is very similar to the one in compensation network 201 (FIG. 3) and is designed to be constant over voltage supply variations. This is the biasing scheme used to bias voltage amplifier 203. Transistor 4Q11 is an emitter follower with its emitter tied to the output node VOH. Its purpose is to provide a high current drive capability to the circuit. The reference circuit must drive more than one output circuit, and thus, requires enough current to insure a constant DC level.

The end results of the circuit shown in FIG. 4 can be expressed in two formulas as follows:

Magnitude: VBIASVOH =

$$\frac{4R8}{4R9} (VCOMPNET - VBG) + VCOMPNET$$

Temp. Coef: TCBIASVOH =

$$\frac{4R8}{4R9} (TCCOMPNET - TCBG) + TCCOMPNET$$

One way of looking at this is by looking at the magnitude of the voltage at node VOH. The voltage at node VOH is equivalent to or is set by the ratio of resistor 4R8 to resistor 4R9 times the voltage at the compensation network minus the voltage of the bandgap regulator. Then we add the voltage of the compensation network to set the VOH level. Thus, if you look at basic op amp design, with inputs from the bandgap regulator, and inputs from the compensation network, you can see what our output voltage is.

In like manner, the temperature coefficient is very similar in that we have the ratio of resistor 4R8 over resistor 4R9 times the temperature coefficient of compnet minus the temperature coefficient of the band gap. We add to that the temperature coefficient of the compnet. This is the final result of the circuit in FIG. 4.

To go back, the temperature coefficient of the band gap is essentially zero, so we can simplify that formula somewhat by removing it. There might be a slight temperature coefficient difference, but it is very small as to be negligible with respect to what we have in compnet.

Bias Voltage VOL

Figure 5:
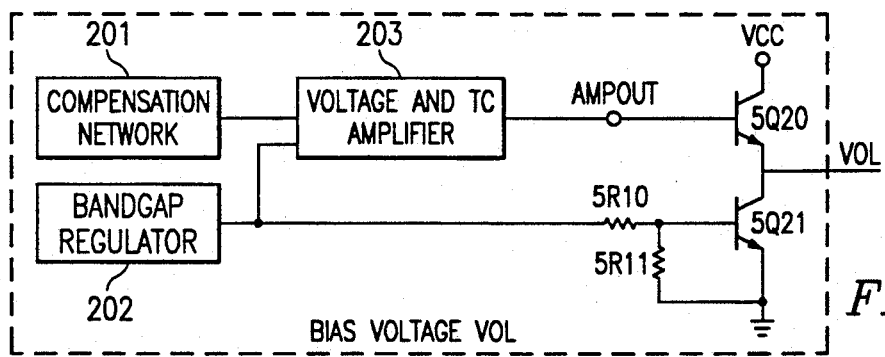
FIG. 5 shows a schematic and block diagram of the voltage low circuit.

In FIG. 5, we have a block diagram of the bias VOL bias generator 50. If we look at node AMPOUT, the output of that node is almost the same as the output of bias VOH generator 20. Compensation network 201 is the same as described in the bias VOH generator and bandgap regulator 202 is also the same as previously discussed. Voltage and temperature coefficient amplifier 203 had its resistor ratio modified slightly to tweak the temperature coefficient and magnitude at node AMPOUT. Where bias VOL generator 50 differs from bias VOH generator 20 is in transistors 5Q20 and 5Q21 and in resistors 5R10 and 5R11. The voltage divider resistors 5R10 and 5R11 take the voltage from bandgap regulator 202 and divide it so as to bias transistor 5Q21 on. Since band gap regulator 202 has zero temperature coefficient, and since we are using a ratio for resistors (as opposed to a single resistor), there is no temperature coefficient change. Thus, the base of transistor 5Q21 has no temperature coefficient associated with it.

Digressing momentarily, as we increase temperature, a VBE of a bipolar transistor (the VBE of transistor 5Q21, for example) shrinks. However, we are forcing a potential cross of the base emitter function of transistor 5Q21, while the VBE is shrinking. Therefore, as temperature increases, the current through transistor 5Q21 increases. Turning our attention to transistor 5Q20, there is a potential on its base from node ampout. Thus, from AMPOUT to node VOL (emitter of transistor 5Q20), we have a drop of one VBE. This is a desirable drop since the voltage on node VOL must be lower than the voltage on node VOH (FIG. 2).

Ampout has approximately the same level as that on node VOH so we must drop that voltage to create the proper magnitude at node VOL. The problem here though is that if we use a VBE as the drop, generally that would add a temperature coefficient. However, as discussed above, at node ampout, we have the proper temperature coefficient so a circuit was designed to drop the voltage without changing the temperature coefficient. That is what is accomplished by transistors 5Q20 and 5Q21 and resistors 5R10 and 5R11.

As discussed, the collector current through transistor 5Q21, since its base voltage is fixed and constant over temperature, will increase with temperature. Transistor 5Q20 is trying to reduce its VBE as temperature increases, while the collector current in transistor 5Q21 increases. Accordingly, the increasing current of transistor 5Q21 is used to offset the temperature coefficient of the VBE of transistor 5Q20, thereby allowing the voltage on node VOL to change properly with temperature, without concern for the additional components, transistors 5Q20, 5Q21 and resistors 5R10 and 5R11.

Figure 6:
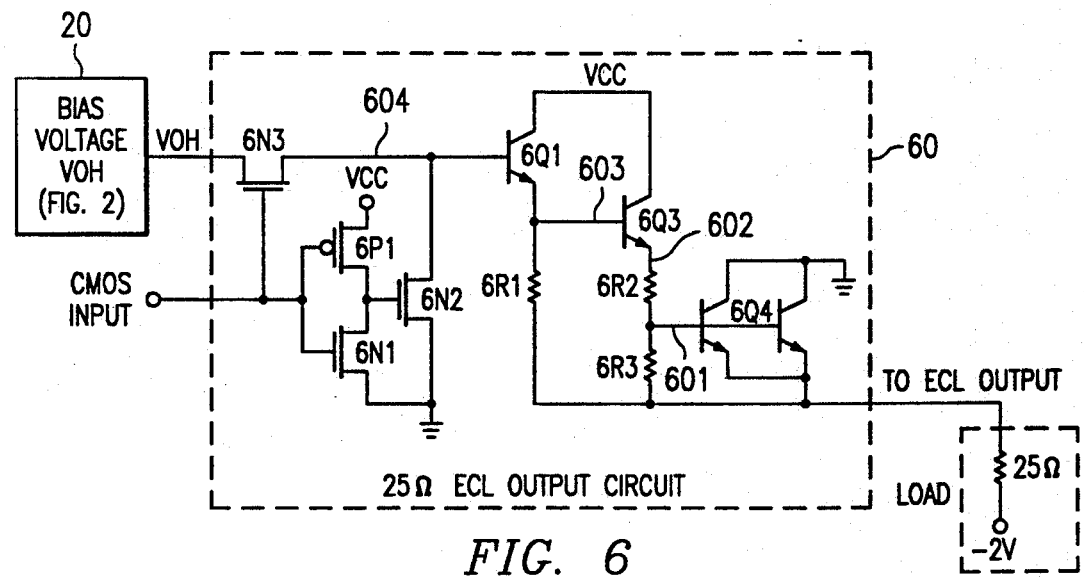
FIG. 6 shows a 25 ohm embodiment of the CMOS to ECL translation circuit.

Now lets look at the 25 ohm ECL output circuit as shown in FIG. 6. The 25 ohm ECL circuit is also labelled "series terminated output circuit" and in this situation the output load is at 25 ohms to a −2 volt supply. In the low (input off) state what we want to happen on the output is a pull down all the way to the −2 volt supply level. The high state is just the same as we had in the 50 ohm case. We want to maintain that same high output level which is approximately −955 millivolts. So in order to obtain the desired output with a −2 volt supply, we must shut off all current to output transistor 6Q4.

It should be noted at this time that in order to achieve the desired output level into a 25 ohm load, the current is doubled from what it was with a 50 ohm load. In the 50 ohm load case, we had approximately 20 mA of current. Now we have 50 mA of current. In order to accomplish this, the size of the output transistor 6Q4 had to double as shown with an additional transistor in parallel with 6Q4. In order to get the output to pull down to the −2 volt level, we must shut off transistor 6Q4, which means we must pull node 601 down to the same level as the output. If any current comes from the output, it would create a voltage drop across the output resistor, elevating the output level. Since we want the output level pulled down to −2 volt supply, we must shut off transistor 6Q4 to pull node 601 very low which we can do if we pull node 603 quite low, which, in turn, shuts off transistor 6Q3, which shuts off 6Q4.

Also, to maintain the proper output high level with a 25 ohm load, circuit resistor 6R2 had to be adjusted slightly to get the proper voltage drop from bias VOH through the VBE drops of transistors 6Q1, 6Q3 and 6Q4.

The AC operation is similar in the low to high transition discussed above in the 50 ohm case, but the high to low transition is a little slower because we must pull the circuit down further than in the 50 ohm version.

Lets now discuss FIG. 7 which is an alternate version of the 50 ohm ECL output circuit. In this circuit we still have the two DC voltage supplies labelled bias VOH and bias VOL and they behave very much in the same manner as in the previous case. The difference in this circuit resides in the manner in which the bias VOH supply 20 to node 703 is shut off. In the previous case, we actually disconnected the bias VOH supply from transistor 1Q1 via switch 1N3 (FIG. 1). In this circuit, the voltage potential on node 702 is disconnected from the voltage potential on node 703. This is accomplished by the use of the N channel transistor 7N1. Thus, if the input is at a high level (+5 volts), 7N1 turns on, thereby connecting node 702 to node 703 so that the bias VOH level, minus a VBE (transistor 7Q1) is on node 702. When 7N1 is turned on, there is no voltage drop there across so we have that same potential on node 703. From node 703 to the output, the circuit behaves exactly the same way as discussed above for FIG. 1.

If a low level (zero volts) is the input, 7N1 is off and resistor 7R4 is used to maintain transistor 7Q1 biased on. This is so that when the circuit goes back the other direction, low to high, transistor 7Q1 will turn on much faster if it is already biased up.

Another version of the 50 ohm ECL output circuit is shown in FIG. 8 and is similar again to the previous circuits mentioned if we look from node 802 to the output. The difference lies in the way the bias VOH and bias VOL levels are connected to transistor 8Q1. In operation a high on the input turns N channel transistor 8N1 on which connects bias VOH to node 801 thereby biasing transistor 8Q1 via resistor 8R1. This sets the potential on node 802.

Now when the input goes low, N channel transistor 8N1 disconnects bias VOH from transistor 8Q1. This is very similar to the circuit in FIG. 1, node 801 which is pulled down through resistor 8R4 to the bias VOL level.

This circuit has fewer components to achieve the same circuit functionality than we had in the previous case. We are able to eliminate one transistor and three MOS devices. The negative with this circuit is that when bias VOH is on node 801, some current flows through resistor 8R4 into bias VOL supply 50 so that the supply must sink current. This is not desirable. Also, when bias VOL is on, current must be supplied through resistor 8R4 to the base of transistor 8Q1.

What is claimed is:

1. A method of providing a bias voltage output controlled as a function of temperature, said method comprising:

generating a first voltage which is constant over a wide temperature range:

generating a second voltage operative to mimic the voltage/temperature characteristics of an output circuit connected to said bias voltage output, including the steps of maintaining a constant current level for a given supply voltage, and providing, under control of a pair of transistors biased under control of said constant current level, a voltage drop as a function of temperature substantially exactly as produced by transistors in said output circuit; and amplifying and mixing said first and second voltages to provide said bias voltage output, including the steps of establishing a differential transistor pair, arranging a pair if transistors into a current mirror pair and using one transistor thereof to set the bias level of said differential transistor pair, maintaining a constant current level for a given supply voltage, and providing an output emitter follower transistor connected to said constant current level and to the base of a first transistor of said differential transistor pair for establishing said bias voltage output at a constant level dependent upon temperature but independent of the number of output circuits connected to bias voltage output.

2. The method set forth in claim 1 further comprising the step of:

connecting said first voltage to said base of said first transistor.

3. The method set forth in claim 2 further comprising the step of:

connecting said first-mentioned pair of transistors to the base of the second transistor of said differential transistor pair.

4. The method set forth in claim 1, wherein said amplifying and mixing step includes causing said bias voltage output to have a temperature coefficient of approximately −4.89 millivolts per degree centigrade.

5. A bias voltage circuit for providing a bias voltage output controlled as a function of temperature, said circuit comprising:

a bandgap regulator circuit having a voltage output which is constant over a wide temperature range:

a compensation network operative to mimic the voltage/temperature characteristics of an output circuit connected to the output of said bias voltage circuit, including a current source for maintaining a constant current level for a given supply voltage, and a pair of transistors biased under control of said constant current, said transistors arranged to provide a voltage drop as a function of temperature substantially exactly as produced by transistors connected in the output circuit; and a circuit for amplifying and mixing the outputs of said bandgap regulator circuit and said compensation network to provide said bias voltage output, including a differential transistor pair coupled between said compensation network and said bandgap regulator circuit, a current mirror pair having one transistor thereof used to set the bias level of said differential transistor pair, a constant current source for maintaining a constant current level for a given supply voltage, and an output emitter follower transistor connected to said constant current source and to the base of a first transistor of said differential transistor pair for providing said bias voltage output at a constant level dependent upon temperature but independent of the number of output circuits connected to said bias voltage circuit.

6. The circuit set forth in claim 5 wherein said voltage from said bandgap regulator is also connected to said base of said first transistor.

7. The circuit set forth in claim 6 wherein said voltage from said compensation network is connected to the base of the second transistor of said differential transistor pair.

8. The circuit set forth in claim 5 wherein the output of said bias voltage circuit varies approximately −4.89 millivolts per degree centigrade.

* * * * *